March 19, 1968 L. F. MILLER 3,374,110
CONDUCTIVE ELEMENT, COMPOSITION AND METHOD
Filed May 27, 1964

INVENTOR
LEWIS F. MILLER
BY George O. Saile
ATTORNEY

United States Patent Office 3,374,110
Patented Mar. 19, 1968

3,374,110
CONDUCTIVE ELEMENT, COMPOSITION AND METHOD

Lewis F. Miller, Wappingers Falls, N.Y., assignor to International Business Machines Corporation, New York, N.Y., a corporation of New York
Filed May 27, 1964, Ser. No. 370,467
20 Claims. (Cl. 117—212)

ABSTRACT OF THE DISCLOSURE

A conductive metallizing composition, mixed with an inert liquid vehicle, is deposited on an insulating substrate, fired at an elevated temperature, and cooled to room temperature to form a conductive element thereon comprising: a homogeneous mixture of an alloy of approximately 75 to 85 percent by weight silver, and 25–15 percent by weight palladium; and a fused vitreous frit for bonding to the dielectric comprising approximately 1–10 percent by weight of the element.

This invention relates to microminiaturized circuits, and more particularly to the conductive elements used in such circuits and to methods for forming the conductive elements on the microminiaturized circuit substrate.

The microminiaturized circuit module is typically a one-half inch square substrate of only a fraction of an inch in thickness, having functional components on its surface electrically connected with printed wiring. The functional components are devices which include one or more active or passive electric circuit elements fabricated as an integrated structure and capable of performing useful functions or operations. The active devices, as one example, secured to the substrate are generally in the order of 25 x 25 mils. The printed conductive elements or wiring between the active and passive devices are in width 5 to 15 mils or less and in thickness 0.5–1.5 mils.

The small cross section of the printed conductor element and its necessary closeness to the high-precision passive and active functional components present severe limitations on the composition of the conductive element. A major requirement is that the conductive element be highly conductive because of the small cross section of the element. Another important aspect is that the conductive element be compatible with passive elements such as resistors. Compatibility between the conductive and passive elements means that the conductive element has negligible contact resistance, low drift and adequate scaling between different sizes of passive elements. The conductive element must also be low in cost, reliably tinned and have good coating and adhesion to substrate characteristics. The conductive element must not be susceptible to oxidation because if portions of its surface are oxidized the solder in the tinning step will not adhere to these areas. The oxidized portions of the conductive element also reduce conductivity.

The metal silver, without more information, would appear to be an ideal conductive element for microminiaturized circuit modules. However, silver has two properties which make it of no apparent use whatsoever as a conductive element in a microminiaturized circuit module. First, silver cannot be soldered with conventional solders of the tin-lead type, because silver will dissolve in the solder bath. Secondly, and more important, silver has the property of migration. Migration is the movement of a material under high voltage conditions. If the conductive elements were made of silver, the silver under high voltage conditions would migrate in excessive amounts even through fibrous or porous solid materials causing shorts across the functional components of the module. It has therefore been believed in the art that silver, even in alloys of low silver concentration, could not be used in the conductive elements of microminiaturized circuit modules.

It is thus an object of this invention to provide a conductive element composed of a highly conductive metallizing composition which is easily applied to and fired on a dielectric substrate.

It is another object of this invention to provide a highly conductive element having no adverse effect on the functional component which it electrically joins on a microminiaturized circuit module.

It is a further object of this invention to provide a highly conductive element composed of a metal composition that is not susceptible to oxidation and therefore can be reliably tin coated.

It is a further object of this invention to provide a conductive element composed of a highly conductive metallizing composition which effectively electrically joins functional components on a microminiaturized circuit module wherein the cross section of the element is 5 to 15 mils or less in width and about 1 mil in thickness, and is easily solderable with conventional lead-tin solders.

It is a still further object of this invention to provide a method for forming conductive elements of a highly conductive metallizing composition which is readily adaptable to mass production techniques and economical in cost compared to other precious metal systems.

These and other objects are accomplished in accordance with the broad aspects of the present invention by providing a conductive metallizing composition adapted to be deposited and fired on a ceramic dielectric to form a conductive element thereon. The conductive element is a homogeneous mixture of an alloy of approximately 75 to 85 percent by weight silver and approximately 25 to 15 percent by weight palladium, and a fused vitreous frit. The element is not susceptible to oxidation and may be soldered with conventional tin-lead solders without erosion of its silver constituent.

The conductive element is formed on a ceramic dielectric by first producing a homogeneous paste by mixing metallic powders and a finely divided vitreous frit with an inert liquid vehicle. The metal powder includes approximately 75 to 85 percent by weight silver powder and approximately 25 to 15 percent by weight palladium powder. The silver and palladium powders can be in the form of the metal or the metal oxide. The silver and palladium powders, and vitreous frit can be sifted through a very fine mesh screen. The powders and the frit are then mixed until they are a completely homogeneous mixture. An inert liquid vehicle is then mixed with the metallic powder and finely divided vitreous frit until a homogeneous paste is formed. The paste is then applied to the ceramic dielectric substrate in the desired pattern by conventional coating techniques. The applied paste on the ceramic substrate is fired at an elevated temperature above approximately 600° C. to form the conductive element.

The element on the substrate is then allowed to cool to room temperature.

The foregoing and other objects, features and advantages of the invention will be apparent from the following more particular description of the preferred embodiment of the invention, as illustrated in the accompanying drawings.

Figure 1:
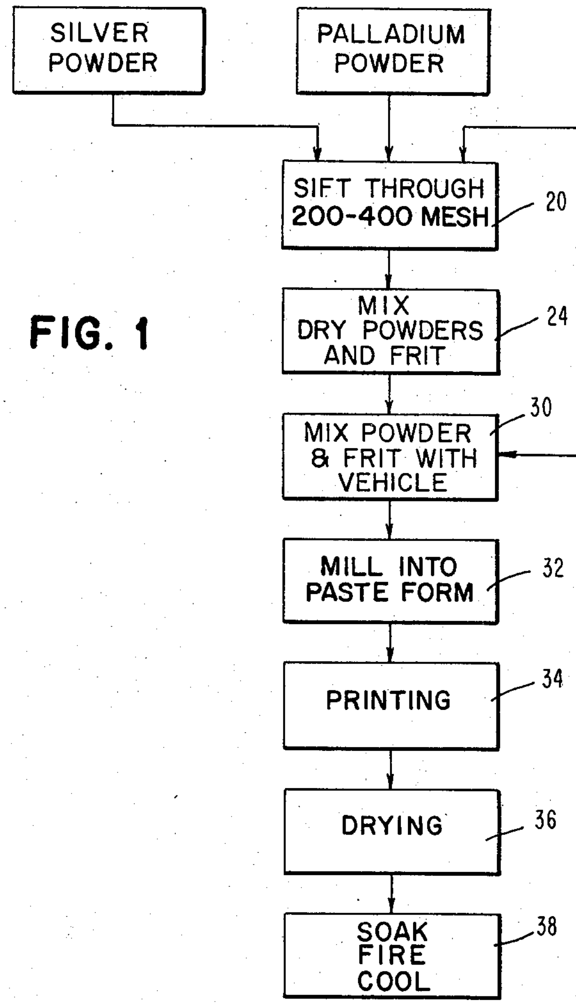
FIGURE 1 is a flow diagram illustrating the method required for fabricating the conductive element of the present invention.
Figure 2:
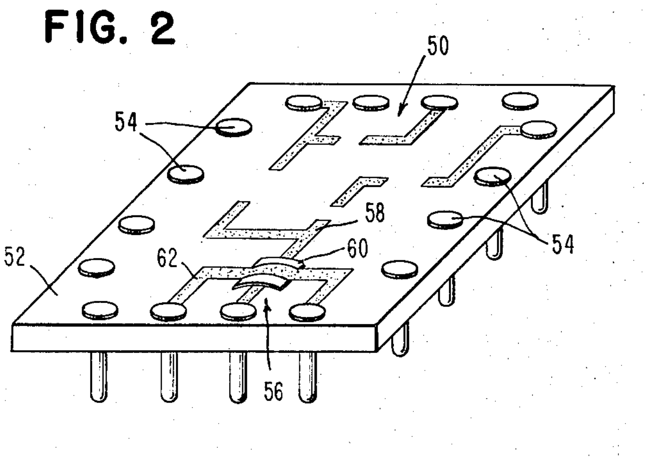
FIGURE 2 is a perspective illustration of a pattern of conductive elements on a ceramic substrate.

Referring now, more particularly, to the flow diagram of FIGURE 1 there is given a summary of the method of fabricating a conductive element pattern such as shown in FIGURE 2. The silver and palladium powders, and the vitreous frit, are sifted through a 200 to 400 mesh screen using gentle shaking as indicated by step 20. Only powders passing through the screen are used in succeeding method steps to avoid the presence of large particles. The dry metal powders together with the vitreous frit are then placed in a non-contaminating container and are uniformly mixed as given by step 24 by means of a mechanical shaker shaking the container. The uniformly mixed powders and frit are now ready to be mixed with the vehicle.

The vehicle used for the metallic powder preferably includes a vaporizable solid, a resinous binder and a solvent for the vaporizable solid and binder. The vaporizable solid in the vehicle results in essential dimensional stability of the printed line. Examples of applicable vaporizable solids are terephthalic acid, furoic acid and ammonium carbonate and ammonium sulfate. The binder material is used to retain the powders and frit on the substrate when the solvent and a vaporizable solid have been removed. Examples of binders include natural gums, synthetic resins, cellulose resinous materials and the like. The solvent imparts the desired viscosity to the printing paste. The solvent is selected so that it will dissolve the binder and dissolve or disperse the vaporizable solid used in the vehicle. Commonly used solvents are the higher boiling paraffins, cycloparaffins and aromatic hydrocarbons or mixtures thereof; or one or more of the mono- and dialkyl ethers of diethylene glycol or their derivatives such as diethylene glycol monobutyl ether acetate. The elements of the vehicle are premixed into solution before mixing with metallic powder and vitreous frit. A complete description of the vehicle, its components and desirable properties is not included herein because it is subject of the U.S. patent application Ser. No. 334,544, filed Dec. 30, 1963, and now abandoned, which is assigned to the assignee of the present invention and is fully described therein.

The premixed metal powders and frit are combined with the inert vehicle together with a suitable surfactant and are thoroughly and homogeneously mixed until a paste of the desired viscosity is formed in the method steps 30 and 32. Standard mixing apparatuses may be used such as a mortar and pestle, a blade type mixer or the like. There is no need for attrition. The mixing phase 30 is needed only for homogeneity and to avoid breaking-out of metal powder in the subsequent milling operation. The second part of the mixing operation is a milling step 32. A three roll mill is preferably used to further disperse the metal powder in the vehicle. The mill temperature should not be allowed to raise much above room temperature to avoid excess volatilization of the vehicle. The paste is removed from the mill and is now ready for application to the substrate.

A conductive element is printed onto the dielectric substrate, such as the conductive element pattern 50 on substrate 52, in FIGURE 2, by silk screening or other conventional printing processes as step 34. The substrate is, of course, thoroughly cleaned and free from grease or other extraneous material before printing is attempted. A silk screen having the desired circuit pattern is placed over the clean substrate. The paste is squeegeed, doctored, or extruded onto the screen. Pressure is applied to spread the paste through the screen and onto the substrate. The pattern in the screen is reproduced at a thickness determined by a number of variables, for example, squeegee pressure and angle, paste viscosity, screen openings, and mask thickness. The screen is removed from the substrate and the printed metallizing paste composition is ready to be dried and fired. The printed pattern is dried as indicated as drying step 36 at room temperature or above. Most of the liquid is thereby removed and the resulting printed pattern is a solid.

The firing step 38 includes a cycle of soaking, firing and cooling. The period during which the temperature of the printed paste on the substrate is gradually being increased to that of the firing temperature is called the soaking period. It is during the soaking period that the last traces of the solvent of the paste evaporate. Then, as the temperature increases, the vaporizable solid in the vehicle completely sublimes. Finally, the binder constituent is decomposed and substantially removed from the paste as gaseous combustion products. The vitreous frit fuses at the firing temperature to produce a durable fired conductive element pattern on the dielectric substrate. The firing temperature and time of firing, of course, are largely dependent upon the particular vitreous frit used. However, a minimum firing temperature is required where either silver oxide or palladium oxide is included as the metal powder to allow the metal oxide to be reduced to the pure metal during firing. The dielectric substrate having the now fused pattern of conductive elements is brought to room temperature. X-ray analysis has shown complete alloying of the silver and palladium after firing as low as 600° C. for one-half hour.

Subsequent to the preparation of the conductive element pattern, such as pattern 50 in FIGURE 2, the pattern is solder tinned by an immersion into a solder bath maintained at an elevated temperature. The solder coats only the conductive metallic pattern 50 and the terminal pins 54. If there are any portions of the conductive pattern which are oxidized the solder will not wet these portions, thus leaving dewets, that is, portions that are uncoated with solder. The importance of having a metallizing composition which is not susceptible to oxidation is therefore apparent. The solder coating insures a good electrical connection between the pins and the lands, i.e. those portions of the conductive element upon which a functional component is to be secured. The solder on the lands is also used for subsequent active functional component joining to the lads. It is important that the conductive element pattern is not eroded away by contact with the solder bath.

After the conductive elements are secured to the dielectric substrate and the tinning step completed as described above, the functional components such as transistors, diodes and the like are secured in their proper locations on the dielectric substrate. The passive components, resistors, capacitors, and the like may be secured to the substrate before tinning. The methods for accomplishing the securing of these passive and active functional components onto the substrate are more fully described in the patent applications Ser. No. 300,855, filed Aug. 8, 1963 and now Patent No. 3,292,240, and Ser. No. 300,734, filed Aug. 8, 1963, both of which are assigned to the assignee of the present invention.

The composition range of silver and palladium in the conductive element is a critical requirement in producing a highly conductive thin line element that can be reliably soldered without dewets or erosion of the body of the element. The operable composition range of the metallic component of the conductive element is about 75 to 85 percent by weight silver and 25 to 15 percent by weight of palladium. The preferred composition is 78 to 83 percent by weight silver and 22 to 17 percent by weight palladium. Erosion becomes a severe problem as the proportion of silver is increased above about 85 percent. When the palladium is increased above about 25 percent by weight of the metallic component of the element, the surface of the conductive element becomes susceptible to oxidation and cannot be reliably solder coated.

The particle size and surface area of the metallic powders is an important parameter and must be kept within certain limits to allow the production of an acceptable conductive element. The operable surface area for the silver powder is between about 0.5 and 5.0 square meters per gram. The operable palladium powder surface area is between about 5.0 and 40 square meters per gram. Larger metal powder particles which usually give proportionally lower particle surface area, produce slightly higher resistances in the conductive element, poorer adhesion to the substrate and in the subsequent soldering step erosion by the solder becomes a problem. The surface area and particle size of the metal powder not only affects the fired conductive element's performance but also its rheology and screening ability. The larger particles produce greater flow. There is less screen clogging than with small particles if they are not too large to pass through the screen. The small particles have a large highly active surface area which must either be wetted by the vehicle or their activity resolved by agglomerating with nearby particles. The smaller particles, therefore, use up considerably more vehicle to wet out the pigment surface, leaving less vehicle for flow and viscosity phenomena.

The preferred powder surface area for palladium is between about 18 and 28 square meters per gram. The preferred powder surface area for the silver is between 0.5 and 1.5 square meters per gram. These preferred surface areas apply whether or not the powders are in the form of the metal, metal oxide or combinations thereof. Where large particles are used and the adhesion to the substrate of the conductive element is thereby reduced, it is possible to increase the vitreous frit content in the solids constituent to improve the adhesion to the point where it would be if smaller particles were used. This increase in the particle size of the metal powder, with the resultant increase in the vitreous flux content is done, however, at the expense of the conductivity of the resulting conductive element.

The vitreous frit component of the solids constituent is a fusible inorganic solid that bonds the metallic powders to the substrate and to themselves. The vitreous frit may be a fusible metal oxide such as bismuth oxide, an alkali-free borosilicate glass, or other known frit materials. The frit compositions that produce the best all-around performance in the conductive element compositions are the high lead oxide containing lead aluminum borosilicate glasses such as given as glasses A and D in Table III below. It is, of course, understood that each glass frit composition has optimum range of firing conditions. These materials are fused at the firing temperature which may be in the range of about 600° to 1200° C. or greater depending upon the particular vitreous frit used. Where there is a temperature limitation on the dielectric substrate, it is advantageous to use a low firing frit such as a low melting lead aluminum borosilicate glass. Since these vitreous materials remain in the conductive element, the amount used is preferably small because their presence reduces the conductivity of the conductive element. The operable range of inclusion of these materials is between about 1 and 10 percent by weight of the solid constituent. The adhesion of the metal particles to themselves and to the substrate is reduced to a value substantially less than the desired 4000 p.s.i. adhesion at a 600° C. firing temperature where less than about 1 percent of the vitreous frit is used. Alternately, where greater than about 10 percent of frit is used the conductivity and solderability of the narrow conductive elements is reduced unduly. Of course, where heavier conductive elements are usable, higher vitreous frit amounts in the metallizing composition are acceptable. Solder coating of the conductive element becomes more difficult as the amount of frit in the element increases. The preferred vitreous frit range in the solid constituent is 2 to 5 percent by weight. It is also important, since these materials remain in the conductive element after firing, that the vitreous material have no adverse effect upon the functional components which the conductive element joins electrically.

Figure 3:
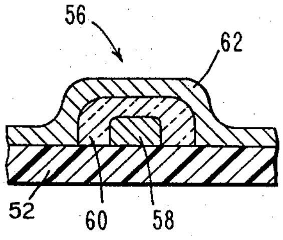
FIGURE 3 is a cross sectional illustration of the cross-over of two conductive elements such as shown in FIGURE 2.

FIGURE 3 illustrates a cross section of the two conductor element crossover 56 shown in FIGURE 2 conductive element pattern. To produce this structure, the conductive element 58 is first applied to the dielectric substrate 52 according to the procedure described above. After firing and cooling to room temperature, a discrete area 60 of dielectric vitreous frit is screened over that portion of the conductive element 58 over which a second conductive element 62 is to be applied. The area 60 is typically 30 by 30 mils in area and 1.5 to 3 mils thick for a 5 to 10 mils wide conductive element. The glass used in this screening can conveniently be one of the glasses or metal oxides used as the vitreous frit in the conductive electrode. This vitreous frit coated area 60 is then fired at the required temperature for fusing the frit and cooled. The conductive electrode 62 is then screened over the fused frit area 60, fired and cooled to room temperature to produce the crossover of two conductive elements as shown at 56. This particular structure requires the use of a conductive element composition that has no tendency to have the migration characteristic. Migration of a metallic constituent of the conductor element composition through the glass dielectric separating the two conductive elements would cause an electrical short between the two elements and a failure in the microminiaturized circuit module.

The conductive element circuit pattern, such as pattern 50 on the small dielectric substrate 52 in FIGURE 2, requires that the individual conductive elements of the pattern be closely spaced to one another. Migration between these individual elements and the resulting electrical shorts is a problem. Completely alloyed silver-palladium elements of the present invention show an unexpected and considerably lower tendency to migrate under electric fields than do pure silver electrodes. In one test, such conductive elements formed .005 inch apart, with a 12 volt bias between the conductive elements, did not show any signs of migration after 2,000 hours at 85° C. and 85 percent relative humidity. In another test, similar conductive elements were observed under a droplet of deionized water, with 2 volts across the elements. Table I shows the result of the water droplet test.

TABLE I

| Conductive element: | Time for bridging (in min.) |
|---|---|
| 90 lead: 10 tin | 0.1 to 0.25 |
| Silver (750°) | 0.2 to 0.4 |
| 80 silver: 20 palladium (750°) | 2.0 to over 5.0 |

The time required for the silver-palladium to form bridging between the electrodes was much longer than pure silver or even 90:10 lead-tin solder.

The following examples are included merely to aid in the understanding of the invention, and variations may be made by one skilled in the art without departing from the spirit of the invention.

*Examples 1 through 8*

Metallic silver powder having a 0.7 powder surface area and metallic palladium powder having a powder surface area of 15 to 25 square meters per gram were individually sifted through a 400 mesh screen. A lead borosilicate glass frit having the following composition given in parts by weight was also sifted through a 400 mesh screen:

| | |
|---|---|
| Silicon dioxide ($SiO_2$) | 22.35 |
| Lead oxide (PbO) | 66.6 |
| Aluminum oxide ($Al_2O_3$) | 2.3 |
| Boron trioxide ($B_2O_3$) | 8.75 |

The following formulation, parts by weight, using only the powders which passed the 400 mesh screen, was made up for each of the examples:

| | |
|---|---|
| Metal powder | 98 |
| Lead borosilicate glass frit | 2 |

The proportion of silver and palladium powder in the metal powder was varied in each example as shown in the Table II.

by immersion in ultrasonically agitated trichloroethylene for 10 minutes. The cleaned substrates were each dipped into rosin flux for 5 seconds. They were next dipped into a tinning bath maintained at 625° F. for 5 seconds. Other substrates were dipped into the same tinning bath for 15 seconds. The composition of the tinning bath was 90 percent by weight lead and 10 percent by weight tin. The substrate and conductive element pattern were then cooled in air and cleaned in trichloroethylene. The substrate was then dried.

The appearance, tinnability, erosion and adhesion of the conductive elements to the substrate for each sample representing their respective example was observed. The conductance for each sample was obtained by standard techniques. The results of these observations and tests are given in Table II.

The tinned elements of Example 1 were very ragged and obviously badly eroded. The tinned conductive ele-

TABLE II

| Ex. | Ag:Pd Parts by Weight | Tinnability | Erosion | | Conductance in ohm/inch/ 15 mils | Adhesion |
|---|---|---|---|---|---|---|
| | | | 5 Sec. | 15 Sec. | | |
| 1 | 90:10 | | Excessive | Excessive | .45 | Good. |
| 2 | 85:15 | Good | None | Minor, at Edges | .54 | Do. |
| 3 | 82:18 | do | do | do | .60 | Do. |
| 4 | 80:20 | Excellent | do | None | | Excellent. |
| 5 | 77:23 | Fair | do | do | .81 | Good. |
| 6 | 75:25 | do | do | do | .81 | Do. |
| 7 | 70:30 | Poor | do | do | .90 | Fair. |
| 8 | 65:35 | do | do | do | 1.20 | Do. |

The dry metal powders and frit were individually weighed out and placed in their respective noncontaminating glass jars for each example. Each of the formulations were mixed for two hours in their respective jars by means of a mechanical shaker. The formulations were by that time homogeneously mixed.

A vehicle for the conductive metallizing paste was made up of the following constituents given in parts by weight:

| | |
|---|---|
| Diethylene glycol monobutyl ether acetate | 77 |
| Ethyl cellulose | 16 |
| 2-furoic acid | 7 |

These ingredients were agitated in a closed high kinetic energy disperser until all of the ethyl cellulose was dissolved. The temperature of the mix was maintained at below 80° C.

The premixed metal powders and frit for each example were combined with the vehicle together with Igepal CO430 surfactant and individually mixed with a mortar and pestle until completely wetted. The following were the parts by weight solid constituent and liquid constituent used for each example:

| | |
|---|---|
| Solids constituent | 78 |
| Vehicle | 20.9 |
| Igepal CO430 [an alkylphenoxypoly (ethyleneoxy) ethanol surfactant] | 1.1 |

In each case the wetted material was taken from the mortar and further individually mixed on a three roll mill to further disperse the pigment in the vehicle. Ten passes were made at a medium type roll setting. The printing paste was removed from the mill and mixed with a spatula to insure uniformity.

Dielectric ceramic substrates composed of 95 percent alumina were thoroughly cleaned by immersion in trichloroethylene. The pastes for each of the examples were applied to their respective ceramic substrates through a silk screen having a 325 mesh size by means of a rubber squeezee. The squeezee was urged against the screen to spread the paste through the screen and onto the substrate to take the pattern of the screen. The screens were removed and the substrate and metallic paste for each example was fired in an oven at 750° C. The soak-fire-cool cycle used was 25–30–25 minutes.

The cereamic dielectric substrates having the conductive element pattern on their surfaces were then cleaned ments of Examples 2, 3 and 4 were excellent in appearance. The appearance of the tinned elements of Examples 5 and 6 were generally good but had some dull areas. The Examples 7 and 8 tinned elements had a mottled surface with fissures and many areas deweted or void of solder. The Example 1 was so badly eroded that its tinnability could not be properly evaluated. Examples 2 through 6 had acceptable tinnability. The Examples 7 and 8 had poor tinnability with many areas void of solder. Except for the Example 1, all examples had acceptable erosion test results. The adhesion of the Examples 1 through 6 was acceptable, while the Examples 7 and 8 were only fair. The Examples 7 and 8 conductive elements could be somewhat easily lifted from the substrate. The conductance increased with increased silver content as expected. The conductance results were in each case considered excellent particularly when they are compared with the commonly used gold-platinum conductive elements which have a conductance of the order of 7.5 ohms/inch/15 mils.

*Examples 9 through 15*

The procedures of Examples 1 through 8 were followed in making up the pastes, printing the conductive elements on substrates and firing the printed elements which represent Examples 9 through 15. The silver to palladium content of each example, however, was maintained constant to 80 parts by weight silver to 20 parts by weight palladium. The powder surface area of the palladium metal used was 20 to 25 square meters per gram. The powder surface area for the silver metal was 0.7 square meter per gram. The compositions of the vitreous frits and the firing temperature variations used in these examples are given in Table III. In each case the sample was maintained at the indicated firing temperature for 30 minutes.

TABLE III

| Composition | Vitreous Frits | | | |
|---|---|---|---|---|
| | A | B | C | D |
| Silicon dioxide ($SiO_2$) | 22.35 | 30.6 | | 10.0 |
| Lead oxide (PbO) | 66.6 | 51.1 | | 85.0 |
| Aluminum oxide ($Al_2O_3$) | 2.3 | 3.2 | | 1.0 |
| Boron trioxide ($B_2O_3$) | 8.75 | 9.0 | | 4.0 |
| Titanium dioxide ($TiO_2$) | | 2.0 | | |
| Cadmium oxide (CdO) | | 3.0 | | |
| Zinc oxide ($ZnO_2$) | | 1.1 | | |
| Bismuth trioxide ($Bi_2O_3$) | | | 100 | |

The particular vitreous frit and the amount by weight included in the solids constituent in each example was changed according to the Table IV.

TABLE IV

| Example | Vitreous Frit | Parts by Wt. Frit of Solid Constituent | Firing Temp. in ° C. | Tinnability | Erosion | Adhesion |
|---|---|---|---|---|---|---|
| 9 | A | 2 | 750 | Excellent | None | Good. |
| 10 | B | 2 | 800 | do | do | Do. |
| 11 | A | 5 | 750 | do | do | Excellent. |
| 12 | A | 2 | 750 | do | do | Do. |
| | C | 5 | | | | |
| 13 | A | 2 | 750 | Excellent | None | Do. |
| | C | 2 | | | | |
| 14 | D | 5 | 600 | Excellent | None | Do. |
| 15 | C | 10 | 750 | Good | do | Good. |

The ceramic dielectric substrates having the conductive element pattern on their surfaces were in turn cleaned, dipped in the solder flux, dipped in the solder bath, cooled and dried according to the procedure and conditions given in Examples 1 through 8.

The appearance, tinnability, erosion and adhesion of the conductive elements for each of the samples representing their respective example was observed. The results of these observations are given in Table IV. All examples had acceptable tinnability, erosion and adhesion to substrate characteristics.

The invention thus provides a conductive element and a method for making the element that is highly conductive and usable in the form of a conductive element having as little as 5 mils in width and 1 mil in thickness. The element has no adverse effects on functional components attached to its body. The conductive elements have been successfully operated with many types of glazed resistor elements. Further, the elements are not susceptible to either oxidation of its surface or erosion from conventional solder baths.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A conductive metallizing composition adapted to be deposited and fired on a ceramic dielectric to form a conductive element thereon comprising:
a homogeneous mixture of approximately 75 to 85 percent by weight silver and approximately 25 to 15 percent by weight palladium; and
a fused vitreous frit, said frit comprising approximately 1–10 percent by weight of said composition.

2. The composition according to claim 1 wherein:
the mixture comprises, approximately 78–83 percent by weight silver, and 22–17 percent by weight palladium; and
the frit comprises approximately 2–5 percent by weight of the composition.

3. The composition according to claim 1 wherein:
the mixture comprises, approximately 80 percent by weight silver, and 20 percent by weight palladium; and
the frit comprises approximately 5 percent by weight of the composition and includes in parts by weight the oxides of silicon 22.35, lead 66.6, aluminum 2.3, and boron 8.75.

4. The composition according to claim 1 wherein:
the mixture comprises, approximately 80 percent by weight silver, and 20 percent by weight palladium; and
said frit includes a first constituent comprising approximately 2 percent by weight of said composition and having, in parts by weight the oxides of silicon 10, lead 66.6, aluminum 2.3, boron 8.75, and
a second constituent comprising approximately 5 percent by weight of said composition and having, in parts by weight the oxide of bismuth 100.

5. The composition according to claim 1 wherein:
the mixture comprises 80 percent by weight silver, and 20 percent by weight palladium; and
the frit comprises, approximately 5 percent by weight of the composition and includes, in parts by weight the oxides of silicon 10, lead 85, aluminum 1.0 and boron 4.0.

6. A conductive metallizing composition adapted to be deposited and fired on a ceramic dielectric to form a conductive element thereon comprising:
a homogeneous mixture of approximately 75 to 85 percent by weight silver and approximately 25 to 15 percent by weight palladium; and
a fused borosilicate glass vitreous frit, said frit comprising approximately 1–10 percent by weight of said composition.

7. The conductive metallizing composition of claim 6 wherein a portion of said borosilicate glass frit is replaced by bismuth trioxide.

8. An electrical conductor for a printed circuit comprising:
a ceramic dielectric;
and a conductor element on the surface of said dielectric;
said conductor element comprising a homogeneous mixture of an alloy of approximately 75 to 85 percent by weight silver and approximately 25 to 15 percent by weight palladium, and a finely divided frit comprising approximately 1–10 percent by weight of said element.

9. The conductor according to claim 8 wherein:
the alloy comprises, approximately 80 percent by weight silver, and 20 percent by weight of palladium; and
the frit comprises approximately 5 percent by weight of said element, and includes, in parts by weight the oxides of silicon 22.35, lead 66.6, aluminum 2.3, and boron 8.75.

10. The conductor according to claim 8 wherein:
the alloy comprises 80 percent by weight silver, and 20 percent by weight palladium; and
said frit includes a first constituent comprising approximately 2 percent by weight of said element and having, in parts by weight the oxides of silicon 10, lead 66.6, aluminum 2.3, boron 8.75, and
a second constituent comprising approximately 5 percent by weight of said element and having, in parts by weight the oxide of bismuth 100.

11. The conductor according to claim 8 wherein:
the alloy comprises, approximately 80 percent by weight silver, and 20 percent by weight palladium; and
the frit comprises, approximately 5 percent by weight of said element and includes, in parts by weight the oxides of silicon 10, lead 85, aluminum 2.0, and boron 4.0.

12. The conductor according to claim 8 including a coating of metal applied to said element.

13. The conductor according to claim 12 wherein said metal is a lead-tin solder.

14. A crossover bonded to the surface of an insulating substrate comprising:
first and second conductors, said conductors being disposed at an angle to one another and comprising a homogeneous mixture of an alloy of approximately 75 to 85 percent by weight silver and approximately 25 to 15 percent by weight palladium and a fused vitreous frit comprising 1–10 percent by weight of said conductors; and a thin film insulating member interposed between said conductors.

15. An electrical conductor for a printed circuit comprising:

a ceramic dielectric;

and a conductor element on the surface of said dielectric;

said conductor element comprising a homogeneous mixture of an alloy of approximately 78 to 83 percent by weight silver and approximately 22 to 17 percent by weight palladium, and a fused finely divided borosilicate glass frit;

said alloy being about 93 to 98 percent by weight of said conductor element and said frit making up the remaining portion of said element.

16. A conductive metallizing composition adapted to be deposited and fired on a ceramic dielectric to form a conductive element thereon, said composition comprising:

a solids constituent of a metal powder which includes approximately 75 to 85 percent by weight silver in the form of a material taken from the group consisting of silver oxide and silver having a powder surface area of between about 0.5 and 5 square meters per gram, approximately 25 to 15 percent by weight palladium in the form of a material taken from the group consisting of palladium oxide and palladium and having a powder surface area of between about 5 and 40 square meters per gram, and a finely divided vitreous frit comprising approximately 1–10 percent by weight of said solids constituent;

and an inert liquid vehicle.

17. A conductive metallizing composition adapted to be deposited and fired on a ceramic dielectric to form a conductive element thereon, said composition comprising:

a solids constituent of a metal powder which includes approximately 78 to 83 percent by weight silver in the form of a material taken from the group consisting of silver oxide and silver having a powder surface area of between about 0.5 and 1.5 square meters per gram and approximately 22 to 17 percent by weight palladium in the form of a material taken from the group consisting of palladium oxide and palladium and having a powder surface area of between about 18 to 28 square meters per gram, and a finely divided borosilicate glass frit;

said metal powder being about 93 to 98 percent by weight of said solids constituent and said frit making up the remaining portion of said constituent;

and an inert liquid vehicle.

18. A method for forming a conductive element composed of a homogeneous alloy of silver and palladium on a ceramic dielectric comprising:

forming a homogeneous paste by mixing comprising a solids constituent of a metallic powder and a finely divided vitreous frit with an inert liquid vehicle;

said metal powder including approximately 75 to 85 percent by weight silver in the form of a material taken from the group consisting of silver oxide and silver, and approximately 25 to 15 percent by weight palladium in the form of a material taken from the group consisting of palladium oxide and palladium;

said frit comprising approximately 1–10 percent by weight of said solids constituent;

applying said paste to said dielectric;

firing said paste on the said dielectric at a temperature of between about 600° and 1200° C. to form said conductive element; and cooling said element to room temperature.

19. A method for forming a conductive element composed of a homogeneous alloy of silver and palladium on a ceramic dielectric comprising:

forming a homogeneous paste by mixing a metallic powder and a finely divided vitreous frit with an inert liquid vehicle;

said metal powder including approximately 75 to 85 percent by weight silver having a powder surface area of between about 0.5 and 5 square meters per gram in the form of a material taken from the group consisting of silver oxide and silver, and approximately 25 to 15 percent by weight palladium having a powder surface area of between about 5 and 40 square meters per gram in the form of a material taken from the group consisting of palladium oxide and palladium;

said metal powder being about 93 to 98 percent by weight of the solids portion of said paste and said frit making up the remaining portion of the solids of said paste;

applying said paste to said dielectric;

firing said paste on said dielectric at a temperature of between about 600° and 1200° C. to form said conductive element; and cooling said element to room temperature.

20. A method for forming a conductive element composed of a homogeneous alloy of silver and palladium on a ceramic dielectric comprising:

uniformly mixing a metal powder and a finely divided borosilicate glass frit in their dry state;

forming a homogeneous paste by mixing the uniformly premixed said metallic powder and said frit with an inert liquid vehicle;

said metal powder including approximately 78 to 83 percent by weight silver having a powder surface area of between about 0.5 and 1.5 square meters per gram in the form of a material taken from the group consisting of silver oxide and silver, and approximately 22 to 17 percent by weight palladium having a powder surface area of between about 18 and 28 square meters per gram in the form of a material taken from the group consisting of palladium oxide and palladium;

said metal powder being about 93 to 98 percent by weight of the solids portion of said paste and said frit making up the remaining portion of the solids of said paste;

applying said paste to said dielectric;

firing said paste on the said dielectric at a temperature of between about 600° and 1200° C. to form said conductive element; and cooling said element to room temperature.

References Cited

UNITED STATES PATENTS 2,924,540 2/1960 D'Andrea ---------- 117—227

FOREIGN PATENTS 904,936 9/1962 Great Britain.

WILLIAM L. JARVIS, *Primary Examiner.*